United States Patent
Nakamura et al.

(10) Patent No.: US 10,927,446 B2
(45) Date of Patent: Feb. 23, 2021

(54) METHOD FOR PRODUCING TRANSPARENT OPTICAL FILM AND METHOD FOR PRODUCING TRANSPARENT MULTILAYER FILM

(71) Applicant: FUJIFILM Corporation, Tokyo (JP)

(72) Inventors: Seigo Nakamura, Kanagawa (JP);
Kenichi Umeda, Kanagawa (JP);
Yuichiro Itai, Kanagawa (JP);
Shinichiro Sonoda, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 16/568,905

(22) Filed: Sep. 12, 2019

(65) Prior Publication Data

US 2020/0002804 A1 Jan. 2, 2020

Related U.S. Application Data

(63) Continuation of application No. PCT/JP2018/003484, filed on Feb. 1, 2018.

(30) Foreign Application Priority Data

Mar. 17, 2017 (JP) .............................. JP2017-052970

(51) Int. Cl.
*C23C 14/24* (2006.01)
*C23C 14/08* (2006.01)
(Continued)

(52) U.S. Cl.
CPC .............. *C23C 14/24* (2013.01); *C23C 14/08* (2013.01); *C23C 14/18* (2013.01); *G02B 1/115* (2013.01)

(58) Field of Classification Search
CPC ......... C23C 14/24; C23C 14/18; C23C 14/08; C23C 28/345; C23C 28/32; C23C 8/10;
(Continued)

(56) References Cited

U.S. PATENT DOCUMENTS

2010/0195231 A1 8/2010 Suzuki et al.
2012/0305964 A1* 12/2012 Akaike ............... H01L 33/0079
257/98
(Continued)

FOREIGN PATENT DOCUMENTS

CN 103424788 A 12/2013
CN 105807986 A 7/2016
(Continued)

OTHER PUBLICATIONS

UTexas (http://ch302.cm.utexas.edu/echem/echem-cells/selector.php?name=std-red-potentials, accessed online Sep. 10, 2020) (Year: 2014).*

(Continued)

*Primary Examiner* — Michael P Wieczorek
*Assistant Examiner* — Michael G Miller
(74) *Attorney, Agent, or Firm* — Birch, Stewart, Kolasch & Birch, LLP (57) ABSTRACT

This method for producing a transparent optical film includes a film formation step of forming a silver layer and a high standard electrode potential metal layer so as to be laminated on a substrate, the film formation step including a silver deposition step of forming the silver layer, at a thickness of 6 nm or less by vacuum deposition, and a high standard electrode potential metal deposition step of forming the high standard electrode potential metal layer formed of a high standard electrode potential metal having a higher standard electrode potential than that of silver by vacuum deposition, and an alloying step of forming a silver alloy layer by diffusing the high standard electrode potential metal within the silver layer by performing a heating treatment at a temperature of 50° C. or higher and 400° C. or lower.

19 Claims, 7 Drawing Sheets

(51) Int. Cl.
*C23C 14/18* (2006.01)
*G02B 1/115* (2015.01)

(58) Field of Classification Search
CPC ........... C23C 8/02; C23C 10/28; C23C 10/60;
C23C 10/02; G02B 1/115; G02B 1/116;
B32B 37/06; B32B 15/01; B32B 7/02
USPC .............................. 427/248.1–255.7, 162–169
See application file for complete search history.

(56) References Cited

U.S. PATENT DOCUMENTS

| | | | |
|---|---|---|---|
| 2013/0308192 A1 | 11/2013 | Shimoda | |
| 2017/0191154 A1 | 7/2017 | Toshimori et al. | |
| 2018/0095192 A1* | 4/2018 | Sonoda | ................. G02B 15/20 |
| 2019/0170908 A1* | 6/2019 | Umeda | ................. C23C 14/024 |

FOREIGN PATENT DOCUMENTS

| | | | | |
|---|---|---|---|---|
| JP | 9-213654 A | 8/1997 | | |
| JP | 2001-324601 A | 11/2001 | | |
| JP | 2007-206146 A | 8/2007 | | |
| JP | 2010-157497 A | 7/2010 | | |
| JP | 2012-248795 A | 12/2012 | | |
| JP | 2013-238709 A | 11/2013 | | |
| WO | WO 2009/041529 A1 | 4/2009 | | |
| WO | WO 2016/136590 A1 | 9/2016 | | |
| WO | WO 2016/189848 A1 | 12/2016 | | |
| WO | WO-2016189848 A1 * | 12/2016 | ............... | B32B 9/00 |
| WO | WO-2018043516 A1 * | 3/2018 | ......... | C23C 14/5893 |

OTHER PUBLICATIONS

International Preliminary Report on Patentability for PCT/JP2018/003484 dated Aug. 14, 2018.
International Search Report for PCT/JP2018/003484 dated Mar. 13, 2018.
Written Opinion of the International Searching Authority for PCT/JP2018/003484 dated Mar. 13, 2018.
Chinese Office Action and Search Report dated Jan. 21, 2020, for Chinese Application No. 201880018079.7, with Partial translation.
Sun Cheng-Song, "Thin Film Technology and Applications", Northeastern University Press, Aug. 1998, pp. 57-50, 6 pages total.
Chinese Office Action, dated Jul. 10, 2020, for Chinese Application No. 201880018079.7, with an English machine translation.

* cited by examiner

METHOD FOR PRODUCING TRANSPARENT OPTICAL FILM AND METHOD FOR PRODUCING TRANSPARENT MULTILAYER FILM

CROSS-REFERENCE TO RELATED APPLICATIONS

This application is a continuation application of International Application No. PCT/JP2018/003484, filed Feb. 1, 2018, the disclosure of which is incorporated herein by reference in its entirety. Further, this application claims priority from Japanese Patent Application No. 2017-052970, filed Mar. 17, 2017, the disclosure of which is incorporated herein by reference in its entirety.

BACKGROUND OF THE INVENTION

1. Field of the Invention

The present invention relates to a method for producing a transparent optical film provided in an antireflection film, a transparent conductive film or the like, and a method for producing a transparent multilayer film using the method.

2. Description of the Related Art

In the related art, in a lens (transparent substrate) formed of a light transmitting member such as glass or plastic, an antireflection film is provided on a light incident surface in order to reduce the loss of transmitted light caused by surface reflection.

As an antireflection film that exhibits a very low reflectance with respect to visible light, constitutions of a fine uneven structure having a pitch shorter than the wavelength of visible light and a porous structure obtained by forming a large number of pores on the uppermost layer thereof are known. In a case of using an antireflection film having a structure layer of a fine uneven structure, a porous structure, or the like on the uppermost layer as a layer of low refractive index, an ultralow reflectance of 0.2% or less can be obtained in a wide wavelength range of a visible light region. However, since these films have a fine structure on the surface thereof, there are defects that the film has low mechanical strength and is very weak to an external force such as wiping. Therefore, portions such as outermost surfaces (first lens front surface and final lens back surface) of a group lens used for a camera lens or the like, which are touched by a user, cannot be subjected to ultralow reflectance coating having a structure layer.

On the other hand, as an antireflection film not including a structure layer on the surface thereof, an antireflection film including a metal layer in a laminate of a plurality of dielectric films is proposed in JP2007-206146A, JP2013-238709A, and the like.

JP2007-206146A discloses that although silver is preferable as a constitutional substance of a metal layer included in an antireflection film, silver is deteriorated and aggregated due to contaminants in the environment, water, oxygen, alkali halogen, and the like and thus an alloy that contains one or more metals of noble metals that are stable to the environment such as gold, platinum, palladium, and the like and rare earths in silver is also preferable. In addition, JP2007-206146A discloses that it is preferable to provide an antifouling layer for preventing adhesion of dirt to the surface of an antireflection film, and for the antifouling layer, organic fluorine compounds and the like may be used.

JP2013-238709A proposes a constitution in which a metal layer containing silver is provided between a laminate formed by alternately laminating a layer of low refractive index and a layer of high refractive index, and a dielectric layer with a surface to be exposed to air in order to realize lower reflectance.

SUMMARY OF THE INVENTION

In the antireflection film disclosed in JP2013-238709A, very good antireflection performance is realized. However, silver is easily oxidized, and in particular, halogen resistance against salt water or the like is low. Moisture and chlorine ions mainly invade from the surface to be exposed to air in the antireflection film, reach the metal layer containing silver, and cause the silver to be oxidized. In a case where the silver is oxidized, the antireflection performance of the antireflection film is lowered. In the antireflection film disclosed in JP2013-238709A, countermeasures for suppressing deterioration of silver are not taken. Thus, it is considered that there is a problem in durability.

In JP2007-206146A, although it is disclosed that the antifouling layer is provided on the outermost surface, this antifouling layer is provided only for the purpose of preventing contamination of the surface and there is no description of the relation with the suppression of deterioration of silver. In addition, actually, even in a case where an antifouling layer is provided, a sufficient silver deterioration suppressing effect is not always obtained.

Further, in JP2007-206146A, it is proposed that a metal thin film layer formed of an alloy containing one or more of noble metals and rare earth metals is used in order to stabilize silver unstable to the environment and any of known methods in the related art such as sputtering, ion plating, vacuum evaporation, and plating can be adopted for the formation of the metal thin film layer.

However, in examples of JP2007-206146A, a specific film forming method in which an Ag—Au alloy is formed as the metal thin film layer is not specified.

As described above, a plurality of film forming methods can be considered to form a metal thin film layer containing silver (hereinafter, a silver alloy layer), but sputtering is particularly frequently used. Silver alloy sputtering targets for forming a silver alloy layer are widely sold. In sputtering, since a material is evaporated using high plasma energy to perform film formation, a silver alloy film having the same composition as the target composition can be formed. On the other hand, for example, in a case of forming an antireflection film formed of a multilayer film including a silver alloy layer, in film formation of a layer of high refractive index and a layer of low refractive index formed of inorganic layers, a vacuum deposition method is frequently used, it is necessary to use sputtering and vacuum deposition in combination, and thus there is a problem of low productivity.

On the other hand, since the element is evaporated by heating to form a film in vacuum deposition, it is not generally used as a film formation method for a silver alloy layer to simultaneously form films using multiple elements with different boiling points. It is necessary to prepare a plurality of heating sources and carry out co-deposition, which causes problems in apparatus cost and difficulty in control.

In addition, the thin silver alloy layer is not limited to utilization as above-mentioned antireflection film, an application to a transparent conductive film or the like is also considered and there is a high need for a transparent optical film containing a silver alloy layer.

The present invention is made in consideration of the above circumstances, and an object thereof is to provide a method for producing a transparent optical film capable of preparing a transparent optical film including a silver alloy layer in which deterioration of silver is suppressed at low cost. Another object of the present invention is to provide a method for producing a transparent multilayer film using the method for producing a transparent optical film.

According to the present invention, there is provided a method for producing a transparent optical film including a silver alloy layer, the method comprising: a film formation step of forming a silver layer and a high standard electrode potential metal layer so as to be laminated on a substrate, the film formation step including a silver deposition step of forming the silver layer, at a thickness of 6 nm or less by vacuum deposition, and a high standard electrode potential metal deposition step of forming the high standard electrode potential metal layer, which is a layer formed of a high standard electrode potential metal that is a metal having a higher standard electrode potential than that of silver, by vacuum deposition; and an alloying step of forming the silver alloy layer by diffusing the high standard electrode potential metal within the silver layer by performing a heating treatment at a temperature of 50° C. or higher and 400° C. or lower.

Any of the silver deposition step and the high standard electrode potential metal deposition step may be performed first. That is, from a substrate side, the silver layer and the high standard electrode potential metal layer may be formed in order, and the high standard electrode potential metal layer and the silver layer may be formed in order.

In the method for producing a transparent optical film according to the present invention, an amount of the high standard electrode potential metal to be deposited in the high standard electrode potential metal deposition step is preferably 10% by atom or less with respect to an amount of silver constituting the silver layer.

In the method for producing a transparent optical film according to the present invention, it is preferable that the film formation step includes an anchor metal deposition step of forming an anchor metal layer formed of an anchor metal having a lower surface energy than silver at a side closer to the substrate than to the silver layer by vacuum deposition, and an oxidation step of oxidizing at least a part of the anchor metal is performed simultaneously with forming the silver alloy layer by performing a heating treatment in the alloying step under an oxygen-containing atmosphere after the anchor metal layer, the silver layer, and the high standard electrode potential metal layer are formed and laminated through the anchor metal deposition step, the silver deposition step, and the high standard electrode potential metal deposition step.

Here, regarding the anchor metal deposition step, the silver deposition step, and the high standard electrode potential metal deposition step, as long as the anchor metal deposition step is performed before the silver deposition step, the high standard electrode potential metal deposition step may be performed at any timing of before the anchor metal deposition step, between the anchor metal deposition step and the silver deposition step, and after the silver deposition step.

In the method for producing a transparent optical film according to the present invention, the film formation step may include an anchor metal deposition step of forming an anchor metal layer formed of an anchor metal having a lower surface energy than silver at a side closer to the substrate than to the silver layer by vacuum deposition, an oxidation step of oxidizing at least a part of the anchor metal by performing a heating treatment under an oxygen-containing atmosphere may be performed after the anchor metal layer and the silver layer are laminated on the substrate in order by performing the anchor metal deposition step and the silver deposition step in this order, and after the oxidation step, the high standard electrode potential metal deposition step may be performed.

Here, the alloying step may be performed simultaneously with the high standard electrode potential metal deposition step.

In the method for producing a transparent optical film according to the present invention, it is preferable to use germanium as the anchor metal.

In the method for producing a transparent optical film according to the present invention, it is preferable to use gold, palladium or platinum as the high standard electrode potential metal, and it is particularly preferable to use gold.

According to the present invention, there is also provided a method for producing a transparent multilayer film comprising:

a first dielectric layer on a substrate by vacuum deposition;

forming a transparent optical film on the first dielectric layer using the method for producing a transparent optical film according to the present invention; and forming a second dielectric layer on the transparent optical film by vacuum deposition to produce a transparent multilayer film.

In the method for producing a transparent multilayer film according to the present invention, as the first dielectric layer, a layer of high refractive index having a relatively high refractive index and a layer of low refractive index having a relatively low refractive index may be alternately formed by vacuum deposition, and an antireflection film having an antireflection function may be produced as the transparent multilayer film.

Here, the expressions "having a relatively high refractive index" and "having a relatively low refractive index" mean that a layer of high refractive index has a refractive index higher than that of a layer of low refractive index and a layer of low refractive index has a refractive index lower than that of a layer of high refractive index.

According to the method for producing a transparent multilayer according to the present invention, since the method includes the film formation step of forming at least a silver layer and a high standard electrode potential metal layer to be laminated on a substrate, the film formation step including a silver deposition step of forming the silver layer having a thickness of 6 nm or less by vacuum deposition, and a high standard electrode potential metal deposition step of forming the high standard electrode potential metal layer, which is a layer formed of a high standard electrode potential metal that is a metal having a higher standard electrode potential than that of silver, by vacuum deposition; and the alloying step of forming the silver alloy layer by diffusing the high standard electrode potential metal within the silver layer by performing a heating treatment at a temperature of 50° C. or higher and 400° C. or lower, and each deposition step for forming each layer is performed not simultaneously but sequentially, there is no need for complicated control such as individual temperature control of multiple deposition sources that cause problems during co-deposition, and it is possible to produce a transparent optical film at low cost.

DESCRIPTION OF THE PREFERRED EMBODIMENTS

Hereinafter, embodiments of a method for producing a transparent optical film of the present invention will be described with reference to the drawings.

Figure 1:
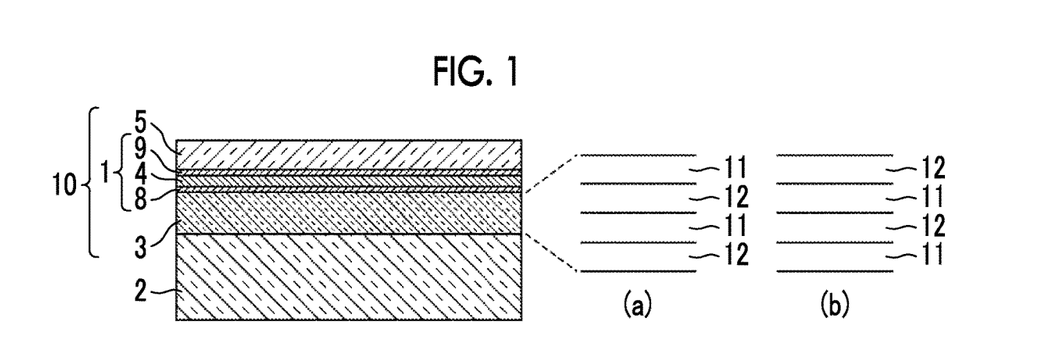
FIG. 1 is a cross-sectional schematic view showing a laminated structure a transparent multilayer film including a transparent optical film prepared by a production method according to the embodiment.

The cross-sectional schematic view of an example of a transparent multilayer film produced by the method for a transparent multilayer film using the method for producing a transparent optical film according to the embodiment of the present invention is shown in FIG. 1.

In a transparent multilayer film 10 shown in FIG. 1, a first dielectric layer 3, a silver alloy layer 4, and a second dielectric layer 5 are formed to be laminated on a substrate 2 in order from the substrate 2 side. The transparent multilayer film 10 includes an anchor region 8 including an oxide of an anchor metal between the first dielectric layer 3 and the silver alloy layer 4, and a cap region 9 including an oxide of an anchor metal between the silver alloy layer 4 and the second dielectric layer 5.

The silver alloy layer 4 is constituted of an alloy of silver (Ag) and a high standard electrode potential metal which is a metal having a higher standard electrode potential than that of silver. The silver alloy layer 4 has high durability compared to a silver layer formed of only silver since the silver alloy layer contains the high standard electrode potential metal.

The anchor metal is a metal having surface energy less than the surface energy of silver. The anchor metal has a function of suppressing granulation of the silver alloy layer 4 and contributes to the formation of a flat silver alloy layer 4.

In the specification, the expression "transparent" means that the internal transmittance with respect to light in a wavelength range of 400 nm to 800 nm (visible light) is 10% or more.

The transparent multilayer film 10 shown in FIG. 1 can be formed and prepared by forming the first dielectric layer 3 on the substrate 2 by vacuum deposition, forming a transparent optical film 1 including the silver alloy layer 4 on the first dielectric layer 3, and further forming the second dielectric layer 5 on the silver alloy layer 4 by vacuum deposition.

In FIG. 1, the anchor region 8, the silver alloy layer 4, and the cap region 9 constitutes the transparent optical film 1 produced by the method for producing a transparent optical film according to the embodiment of the present invention. The transparent optical film 1 prepared in the method for producing a transparent optical film according to the embodiment of the present invention may not include the anchor region 8 and the cap region 9.

Figure 2:
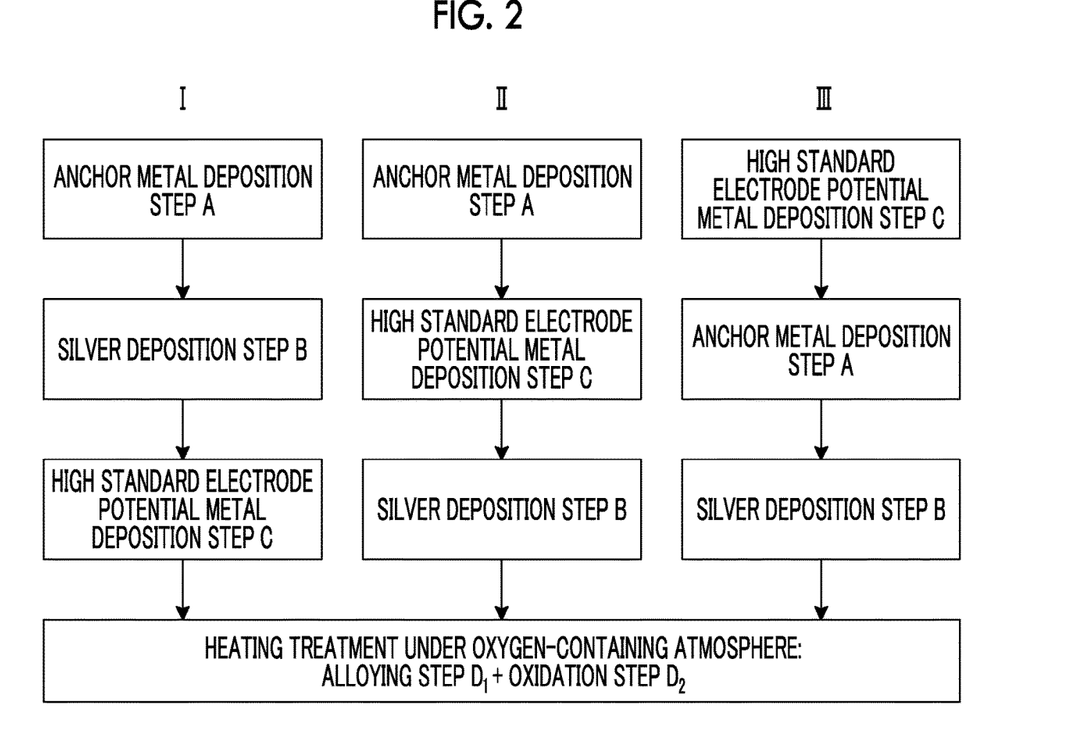
FIG. 2 is a view showing flows of production methods according to first to third embodiments of the present invention.
Figure 4:
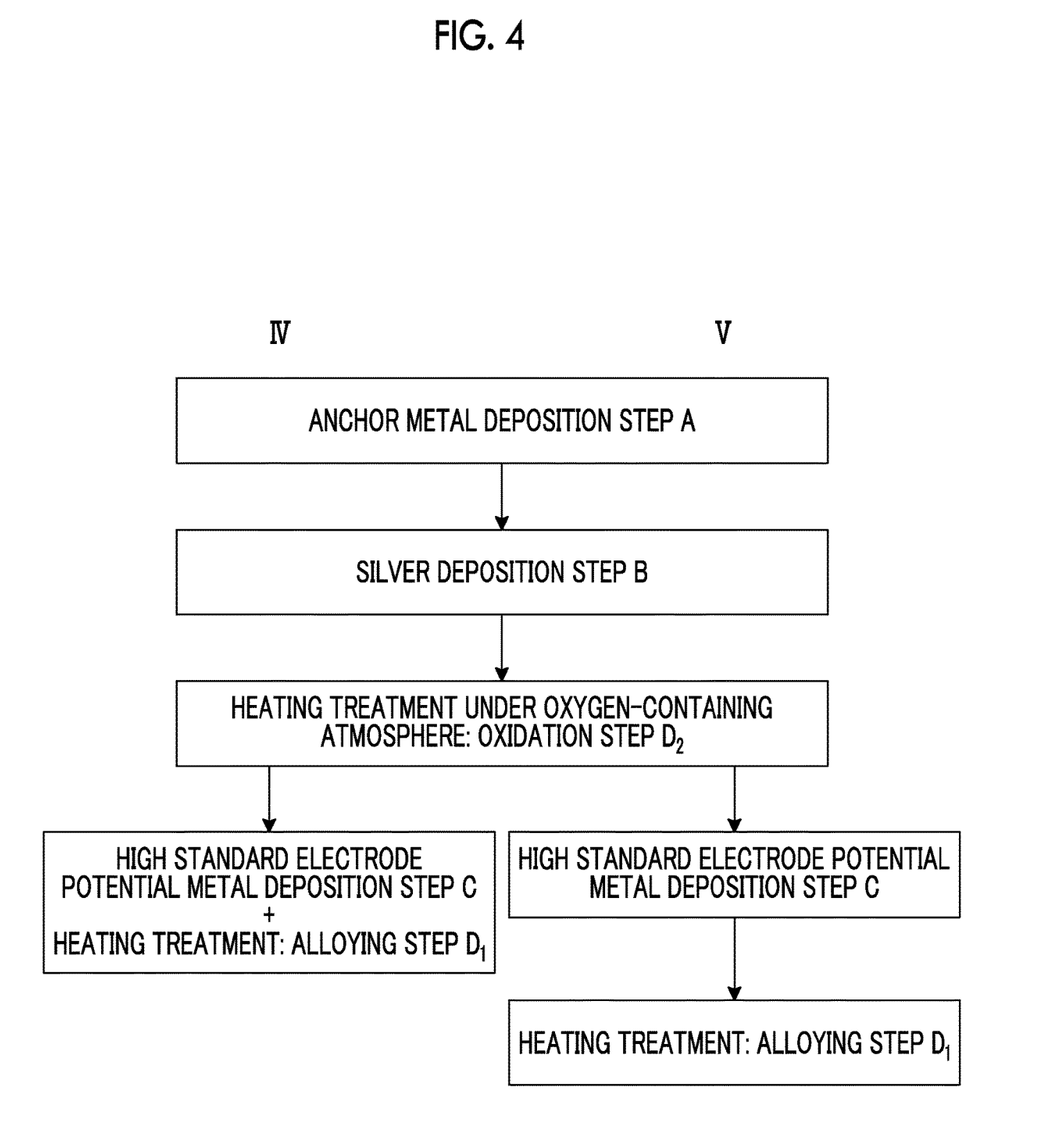
FIG. 4 is a view showing flows of production methods according to fourth and fifth embodiments of the present invention.

The method for producing a transparent optical film according to the embodiment of the present invention includes a film formation step forming at least a silver layer and a high standard electrode potential metal layer to be laminated on a substrate, the film formation step including a silver deposition step B of forming the silver layer having a thickness of 6 nm or less by vacuum deposition, and a high standard electrode potential metal deposition step C of forming the high standard electrode potential metal layer which is a layer formed of a high standard electrode potential metal which is a metal having a higher standard electrode potential than that of silver by vacuum deposition, and an alloying step $D_1$ of forming a silver alloy layer by diffusing the high standard electrode potential metal in the silver layer by performing a heating treatment at a temperature of 50° C. or higher and 400° C. or lower (refer to FIGS. 2 and 4).

As the high standard electrode potential metal to be deposited in the high standard electrode potential metal deposition step, gold (Au), palladium (Pd), and platinum (Pt) may be used. Among these metals, Au has the highest standard electrode potential and is suitable for corrosion prevention. In addition, from the viewpoint of the refractive index and the extinction coefficient, Au is preferable. Since the refractive index of Au is as small as the refractive index of Ag, the influence on antireflective performance is small. On the other hand, since the extinction coefficient (absorbance) is large compared to Ag, the transmittance tends to decrease as the amount of Au increases.

The effect of corrosion prevention can be obtained as long as the high standard electrode potential metal is contained in a small amount, and the durability is improved as the amount thereof increases. On the other hand, there is a correlation between the amount of the high standard electrode potential metal (hereinafter, referred to as "amount of the metal added") and the light absorption amount, and as the amount of the metal added increases, the transmittance decreases. Therefore, from the viewpoint of the transmittance, as the amount of the metal added decreases, the transparency is improved. Assuming that an optical thin film is used as an antireflection film, the absorbance at a wavelength of 550 nm is desirably 10% or less. From the viewpoint of achieving both corrosion resistance and transparency, the amount of the metal added is preferably 10% by atom or less and more preferably 5% by atom or less and 1% by atom or more with respect to the amount of silver.

The temperature of the heating treatment in the alloying step may be 50° C. or higher and 400° C. or lower, and is preferably 200° C. or higher and 400° C. or lower, more preferably 250° C. or higher and 350° C. or lower, and particularly preferably 300° C. as the temperature for not aggregation of Ag and not causing damage to each layer.

Although the heating time is not particularly limited, it is preferable that a heating treatment is performed until the high standard electrode potential metal is uniformly mixed in the silver layer. For example, in a case where heating is performed at 300° C. for 5 minutes, the high standard electrode potential metal can be sufficiently uniformly mixed. The diffusion state and the mixed state of the high standard electrode potential metal in the silver alloy layer can be confirmed by depth direction elemental analysis by X-ray photoelectron spectroscopy (XPS or electron spectroscopy for chemical analysis (ESC)). In the mixed state, the depth profiles of the high standard electrode potential metal and Ag by XPS are almost matched. A case where the depth profiles are matched means that the depth direction positions indicating the concentration peak are matched and the behaviors of the density change are matched but does not mean that the density values are matched.

It is preferable that the film formation step includes the anchor metal deposition step of forming an anchor metal layer formed of an anchor metal having surface energy less than the surface energy of Ag on a side closer to the substrate than to the silver layer by vacuum deposition. Then, in a case where the film formation step includes the anchor metal deposition step, after the anchor metal deposition step and the silver deposition step, an oxidation step of oxidizing at least a part of the anchor metal by performing a heating treatment under an oxygen-containing atmosphere is performed.

The anchor metal is a metal having surface energy less than the surface energy of the silver layer. In the specification, the surface energy (surface tension) $\gamma$ is defined as surface energy calculated using $\gamma=\gamma_0+(t-t_0)(d\gamma/dt)$ from Metals Data Book, Nippon Kinzoku Gakkai, 4th revised edition, p. 16.

Hereinafter, the surface energy of various metal elements at room temperature calculated by the above method is listed.

TABLE 1

| Element | Surface energy γ (mN/m) | Element | Surface energy γ (mN/m) | Element | Surface energy γ (mN/m) |
|---|---|---|---|---|---|
| Bi | 395.22 | Si | 1045.05 | Ti | 2081.6 |
| Pb | 507.26 | Ag | 1052.712 | Cr | 2292 |
| Sn | 558.49 | Al | 1136.25 | Ir | 2317.983 |
| In | 567.844 | Mn | 1333.2 | Ni | 2321.02 |
| Mg | 778.1 | Cu | 1422.54 | Co | 2592.32 |
| Nd | 778.91 | Au | 1679.76 | Fe | 2612.39 |
| Zn | 848.98 | Pd | 1835.94 | Ta | 2888 |
| Ge | 857.34 | Hf | 2032.78 | Mo | 3024.6 |
|  |  | Ga | 718 | W | 3472.08 |

According to the above table, the surface energy of the silver layer is 1053 mN/m.

Therefore, in a case where an ultrathin silver film having large surface energy (6 nm or less) is directed formed on an oxide or nitride film having small surface energy, the silver grain growth is promoted and a smooth ultrathin film is not easily formed. This is because silver is more stable in bonding with each other than by bonding with oxide or nitride. In order to obtain a smooth ultrathin silver film (or silver alloy), during the investigations conducted by the present inventors, the present inventors have found that it is effective to provide an anchor metal layer on the substrate or dielectric layer to be a film forming surface.

As the anchor metal, among the metal elements shown in Table 1, bismuth (Bi), lead (Pb), tin (Sn), indium (In), magnesium (Mg), zinc (Zn), gallium (Ga), germanium (Ge), and silicon (Si), of which the surface energy roughly satisfies a range of more than 200 mN/m and less than 1053 mN/m, are preferable. Pb, Sn, In, Mg, Zn, Ga, and Ge are more preferable. In, Ga, and Ge are even more preferable and particularly preferable is Ge.

In the film formation of the anchor metal layer, the anchor metal layer may be formed as an alloy layer formed of two or more metals or at the time of film formation of the anchor metal layer, a plurality of layers each formed of a single metal may be laminated.

The thickness of the anchor metal layer is preferably 0.2 nm to 2 nm. In a case where the thickness of the anchor metal layer is 0.2 nm or more, granulation of the metal layer to be formed thereon can be sufficiently suppressed. In addition, in a case where the thickness of the anchor metal layer is 2 nm or less, absorption of incident light by the anchor metal layer itself can be suppressed and thus a decrease in the transmittance of the transparent optical film can be suppressed. As the anchor metal, a single metal may be used or two or more metals may be used. At this time, in the anchor metal deposition step, the anchor metal layer may be formed as an alloy layer formed of two or more metals and a plurality of layers each formed of a single metal may be laminated.

The oxygen-containing atmosphere under which a heating treatment is performed in the oxidation step of oxidizing at least a part of the anchor metal is, for example, the atmosphere. The higher the concentration of oxygen is, the more preferable it is. The oxygen partial pressure is preferably 0.01 Pa or more. The temperature of the heating treatment at this time is preferably about 300° C. Since at least a part of the anchor metal can be oxidized by this oxidation step, the transmittance can be improved. In this oxidation step, the diffusion of the anchor metal also occurs at the same time.

The oxidation step can be performed simultaneously with the alloying step by performing the heating treatment under the oxygen-containing atmosphere after all of the anchor metal layer, the silver layer, and the high standard electrode potential metal layer are laminated. In addition, after the anchor metal layer and the silver layer are laminated and before the potential metal layer is laminated, by performing the heating treatment under the oxygen-containing atmosphere, separately from the alloying step, the oxidation step can be performed in the stage before the alloying step.

Figure 3:
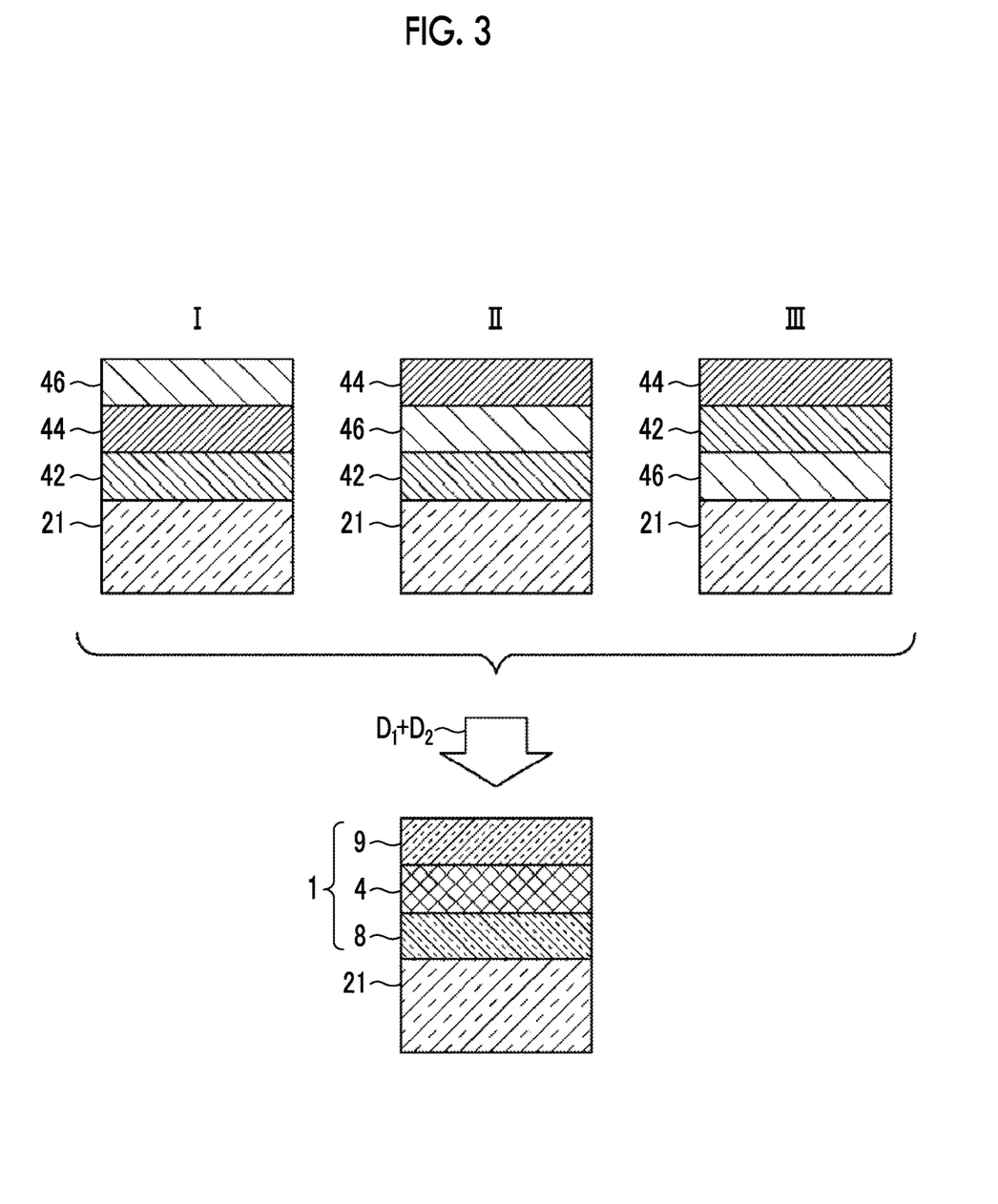
FIG. 3 is a schematic cross-sectional view showing laminated structures in processes of the production methods according to the first to third embodiments of the present invention.
Figure 5:
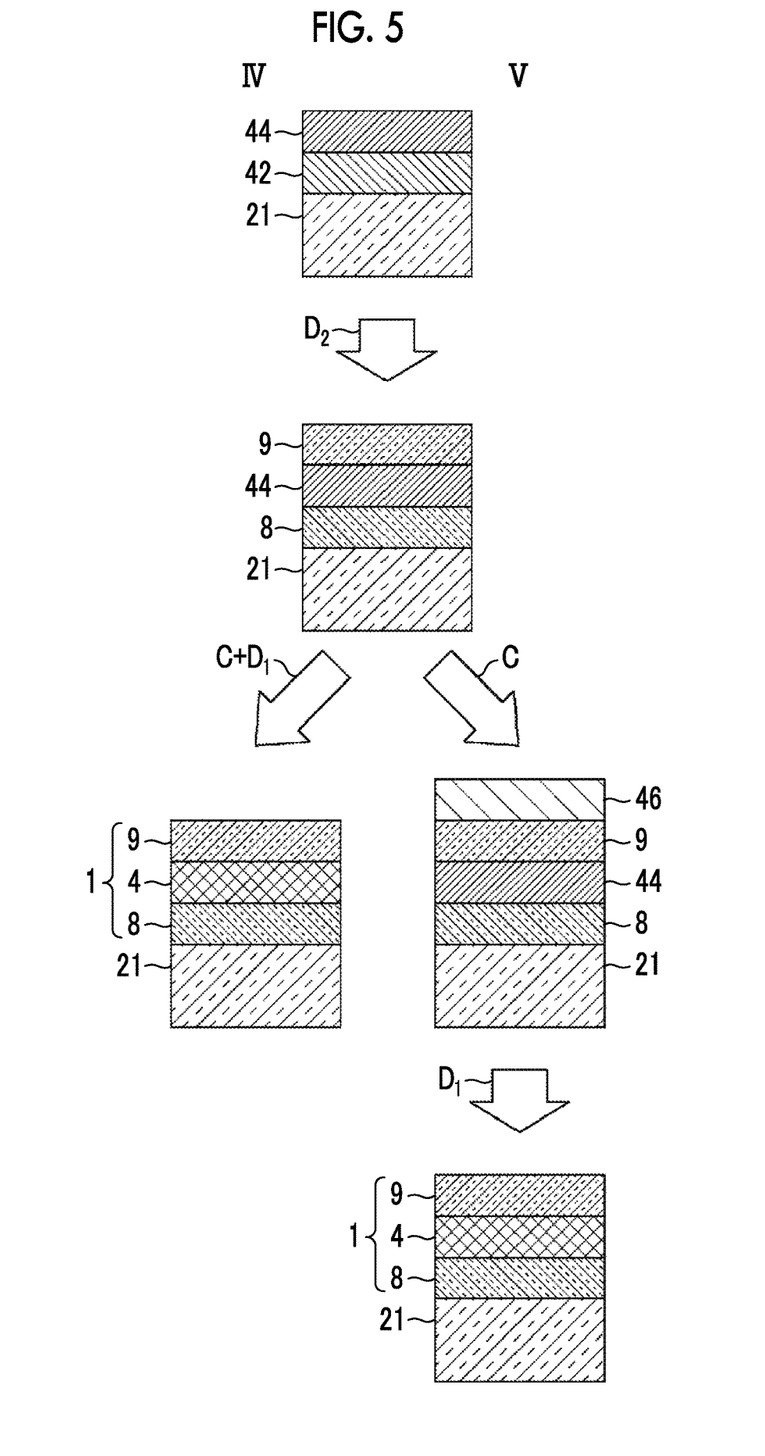
FIG. 5 is a schematic cross-sectional view showing laminated structures in processes of the production methods according to the fourth and fifth embodiments of the present invention.

Hereinafter, as the method for producing the transparent optical film 1 including the anchor region 8, the silver alloy layer 4, and the cap region 9 in the transparent multilayer film 10 shown in FIG. 1, the production methods according to first to fifth embodiments will be described. FIG. 2 is a view showing flows I, II, and III of the production methods according to the first to third embodiments, and FIG. 3 is a view showing layer constitutions in the production processes by the flows I, II, and III. In addition, FIG. 4 is a view showing flows IV and V in the production methods according to the fourth and fifth embodiments, and FIG. 5 is a view showing layer constitutions in the production processes by the flows IV and V.

Production Methods According to First to Third Embodiments

In any of the production methods according to the first to third embodiments, after the film formation step is completed, at least one heating treatment is performed.

In the production method according to the first embodiment, as shown in the flow I in FIGS. 2 and 3, first, an anchor metal layer 42 is formed on a substrate 21 by vacuum deposition as the anchor metal (anchor metal deposition step A), a silver layer 44 having a thickness of 6 nm is formed on the anchor metal layer 42 by vacuum deposition (silver deposition step B), and a high standard electrode potential metal layer 46 which is formed of a high standard electrode potential metal which is a metal having a higher standard electrode potential than that of silver is formed on the silver layer 44 by vacuum deposition (high standard electrode potential metal deposition step C). Here, the substrate 21 is formed such that the first dielectric layer 3 is provided on the substrate 2 itself shown in FIG. 1 or on the substrate 2 shown in FIG. 1.

It is necessary that the anchor metal layer 42 is provided on a side closer to the substrate 21 than to the silver layer 44. However, the lamination order of the high standard electrode potential metal layer 46 is not limited. Accordingly, as the method for producing a transparent optical film according to the second embodiment, as shown in the flow II in FIGS. 2 and 3, the anchor metal deposition step A, the high standard electrode potential metal deposition step C, and the silver deposition step B may be performed in order and the anchor metal layer 42, the high standard electrode potential metal layer 46, and the silver layer 44 may be formed to be laminated in order from the substrate 21 side.

In addition, as the production method according to the third embodiment, as shown in the flow III in FIGS. 2 and 3, the high standard electrode potential metal deposition step C, the anchor metal deposition step A, and the silver deposition step B may be performed in order and the high standard electrode potential metal layer 46, the anchor metal layer 42, and the silver layer 44 may be formed to be laminated in order from the substrate 21 side.

In the production methods according to the first to third embodiments, after the three layers are formed sequentially (after the film formation step), by performing a heating treatment at a temperature of about 300° C. under an oxygen-containing atmosphere, the alloying step $D_1$ and the oxidation step $D_2$ are performed at the same time. By this heating treatment, the high standard electrode potential metal constituting the high standard electrode potential metal layer 46 is diffused in the silver layer 44 to form a silver alloy layer 4 of silver and the high standard electrode potential metal.

In addition, by performing this heating treatment under an oxygen-containing atmosphere, the anchor metal of the anchor metal layer 42 moves to the substrate 21 side and the surface side of the silver alloy layer 4, and the anchor metal moved to the surface side and the anchor metal on the substrate 21 side are partially oxidized. In addition, a very small amount of the anchor metal may remain in the silver alloy layer 4.

As a result, on the substrate 21 shown in the lower drawing in FIG. 3, the transparent optical film I including the anchor region 8 including the anchor metal and an anchor metal oxide and the cap region 9 including the silver alloy layer 4 of silver and the high standard electrode potential metal and an anchor metal oxide is formed.

According to the production method, since a heating treatment may be performed once and this heating treatment performed once serves as the alloying step $D_1$ and the oxidation step $D_2$ of oxidizing the anchor metal, the production is easy.

The anchor region 8 is a region formed by changing the anchor metal layer 42 provided for smoothly forming this silver layer 44 before laminating the silver layer 44 in the production process, and is an interface region between the substrate 21 and the silver alloy layer 4. The cap region 9 is an interface region on the surface side of the silver alloy layer 4 including an anchor metal oxide oxidized at the surface of the silver alloy layer 4 by oxygen in the atmosphere after allowing the anchor metal constituting the anchor metal layer 42 to pass through the silver alloy layer 4 in the production process.

In the anchor region 8, in addition to the anchor metal and the oxide thereof, atoms present in the silver alloy layer 4 and the substrate 21 are mixed and in the cap region 9, in addition to the anchor metal oxide, atoms present in the silver alloy layer 4 are mixed.

In the anchor region 8, an oxidized anchor metal (anchor metal oxide) and an unoxidized anchor metal may be mixed. However, it is desirable that the content of the anchor metal oxide is larger than the content of the unoxidized anchor metal, and it is particularly preferable that the whole anchor metal included in the anchor region 8 is oxidized.

On the other hand, it is preferable that the whole anchor metal included in the cap region 9 is oxidized to form an anchor metal oxide.

The anchor region 8 and the cap region 9 are considered to have the effect of suppressing aggregation of silver into particles. In the production process, at the stage in which the anchor metal layer and the silver layer are formed sequentially, the anchor metal moves. It is considered that since the anchor metal becomes an oxide, the anchor metal is stable, movement of silver is suppressed to achieve aggregation suppression, and the cap performance such as long-term stability, water resistance, and moisture resistance is improved. By heating under the presence of oxygen, most of the anchor metal in the cap region becomes an oxide. At this time, it is preferable that 80% or more of the anchor metal included in the cap region is oxidized and it is more preferable that the whole anchor metal is oxidized to form an anchor metal oxide.

By providing the anchor region and the cap region as described above, it is possible to obtain a transparent optical film having an ultrathin silver alloy layer 4 in which flatness and transparency are compatible.

Production Methods According to Fourth and Fifth Embodiments

In the production methods according to the fourth and fifth embodiments, the oxidation step $D_2$ and the alloying step $D_1$ are separately performed.

In the production methods according to the fourth and fifth embodiments, as shown in the flows IV and V in FIGS. 4 and 5, first, the anchor metal layer 42 is formed on the substrate 21 by vacuum deposition as the anchor metal (anchor metal deposition step A), and the silver layer 44 having a thickness of 6 nm or less is formed on the anchor metal layer 42 by vacuum deposition (silver deposition step B).

Thereafter, after the anchor metal layer 42 and the silver layer 44 are sequentially formed, by performing a heating treatment at about 300° C. under an oxygen-containing atmosphere, the oxidation step $D_2$ of oxidizing the anchor metal is performed. By this heating treatment, the anchor metal of the anchor metal layer 42 moves to the substrate 21 side and the surface side of the silver layer 44 the anchor metal moved to the surface side and the anchor metal on the substrate 21 side are partially oxidized. Thus, a laminated structure of the anchor region 8 including the anchor metal and the anchor metal oxide and the cap region 9 including the silver layer 44 and the anchor metal oxide is formed on the substrate 21. In addition, a very small amount of the anchor metal may remain in the silver layer 44.

The above steps are common to the production methods of the fourth and fifth embodiments.

In the production method according to the fourth embodiment, as shown in the flow IV, after the oxidation step $D_2$, the high standard electrode potential metal is vacuum-deposited on the cap region 9 (high standard electrode potential metal deposition step C). By setting the substrate temperature at the time of deposition to 50° C. or higher and 400° C. or lower, the high standard electrode potential metal deposition step C and the heating treatment as the alloying step $D_1$ are performed at the same time. Thus, the high standard electrode potential metal passes through the cap region 9 while being laminated, and is diffused in the silver layer 44 to form the silver alloy layer 4 of silver and the high standard electrode potential metal.

In the production method according to the fourth embodiment, by the above steps, the transparent optical film 1 including the anchor region 8 including the anchor metal and the anchor metal oxide and the cap region 9 including the silver alloy layer 4 of silver and the high standard electrode potential metal and the anchor metal oxide is formed on the substrate 21.

In the production method according to the fifth embodiment, as shown in the flow V, after the oxidation step $D_2$, the high standard electrode potential metal is vacuum-deposited on the cap region 9 (high standard electrode potential metal deposition step C). Here, by performing the step C while setting the substrate temperature to room temperature, the high standard electrode potential metal layer 46 is formed on the surface of the cap region 9.

Thereafter, by performing a heating treatment at a temperature of 50° C. or higher and 400° C. or lower on a laminate in which the anchor region 8, the silver layer 44, the cap region 9, and the high standard electrode potential metal layer 46 are laminated in order on the substrate 21, the alloying step $D_1$ is performed. The atmosphere of the heating treatment is not particularly limited and may be in vacuum. In the alloying step $D_1$, the high standard electrode potential metal passes through the cap region 9 and diffused in the silver layer 44 to form the silver alloy layer 4 of silver and the high standard electrode potential metal.

In the production method according to the fifth embodiment, by the above steps, the transparent optical film 1 including the anchor region 8 including the anchor metal and the anchor metal oxide and the cap region 9 including the silver alloy layer 4 of silver and the high standard electrode potential metal and the anchor metal oxide is formed on the substrate 21.

As described above, the same transparent optical films I can be prepared by the production methods of the first to fifth embodiments.

The transparent optical film according to the embodiment of the present invention can be applied to a transparent conductive film or an antireflection film.

In the method for producing a transparent optical film according to the embodiment of the present invention, the shape of the substrate 2 on which the transparent optical film is formed is not particularly limited and the substrate is a transparent optical member that is mainly used in an optical device, such as a flat plate, a concave lens, or a convex lens, or a flexible transparent film. As the material for the substrate, glass, plastic, and the like can be used.

The refractive index of the substrate 2 is not particularly limited and is preferably 1.45 or more. The refractive index of the substrate 2 may be 1.61 or more and 1.74 or more and further 1.84 or more. For example, the substrate 2 may be a high power lens such as a first lens of a group lens of a camera or the like. In the present specification, all the refractive indices are refractive indices with respect to light having a wavelength of 500 nm.

In the method for producing a transparent multilayer film according to the embodiment of the present invention, the first dielectric layer and the second dielectric layer to be formed by vacuum deposition are basically formed of a material transparent to visible light.

In a case where an antireflection film is prepared as a transparent multilayer film, the first dielectric layer 3 may be constituted of a single layer having a refractive index different from the refractive index of the substrate 2, and may be constituted of a plurality of layers formed by alternately laminating a layer of high refractive index 11 and a layer of low refractive index 12 as shown in (a) and (b) of FIG. 1. At this time, as shown in (a) of FIG. 1, the layer of low refractive index 12, the layer of high refractive index 11 may be laminated in order from the substrate 2 side and as shown in (b) of FIG. 1, the layer of high refractive index 11 and the layer of low refractive index 12 may be laminated in order from the substrate 2 side. Although the number of the first dielectric layers 3 is not limited, the number of the first dielectric layers is preferably 16 or less from the viewpoint of cost suppression.

The layer of high refractive index 11 may have a high refractive index compared to the refractive index of the layer of low refractive index 12, and the layer of low refractive index 12 may have a low refractive index compared to the refractive index of the layer of high refractive index 11. It is more preferable that the refractive index layer of high refractive index 11 is higher than the refractive index of the substrate 2, and the refractive index of the layer of low refractive index 12 is lower than the refractive index of the substrate 2.

The layers of high refractive index 11 or the layers of low refractive index 12 may not have the same refractive index and a case where the refractive index layers are formed of the same material and have the same refractive index is preferable from the viewpoint of suppressing material cost, film formation cost and the like.

Examples of the material for forming the layer of low refractive index 12 include silicon oxide ($SiO_2$), silicon oxynitride (SiON), gallium oxide ($Ga_2O_3$), aluminum oxide ($Al_2O_3$), lanthanum oxide ($La_2O_3$), lanthanum fluoride ($LaF_3$), magnesium fluoride ($MgF_2$), and sodium aluminum fluoride ($Na_3AlF_6$).

Examples of the material for forming the layer of high refractive index 11 include niobium pentoxide ($Nb_2O_5$), titanium oxide ($TiO_2$), zirconium oxide ($ZrO_2$), tantalum pentoxide ($Ta_2O_5$), silicon oxynitride (SiON), silicon nitride ($Si_3N_4$), silicon niobium oxide (SiNbO), and Substance H4 (manufactured by Merck Group).

The refractive index can be changed to some extent by controlling any of these compounds to have the constitutional element ratio which is shifted from the compositional ratio of the stoichiometric ratio or by forming a film by controlling the film formation density. The materials constituting the low refractive index layer and the high refractive index layer are not limited to the above compounds as long as the materials satisfy the above-mentioned refractive index condition. In addition, unavoidable impurities may be included.

The second dielectric layer may be formed of a single layer or a plurality of layers. Examples of the material constituting the second dielectric layer include $SiO_2$, SiON, $MgF_2$, and $Na_3AlF_6$, and particularly preferable is $SiO_2$ or $MgF_2$. It is particularly preferable to provide a $SiO_2$ layer and a fluorocarbon layer which is provided as a self-assembled film on the $SiO_2$. In a case where the second dielectric layer is formed of a plurality of layers, the refractive index of each layer is preferably 1.35 or more and 1.51 or less. However, the dielectric layer may be provided with a very thin layer having a high refractive index (for example, less than 1 nm). The refractive index can be changed to some extent by controlling any of these compounds to have the constitutional element ratio which is shifted from the compositional ratio of the stoichiometric ratio or by forming a film by controlling the film formation density.

In a case where the transparent multilayer film is an antireflection film, the thickness (total thickness) of the second dielectric layer is preferably about $\lambda/4n$ in a case in which a target wavelength is $\lambda$ and the refractive index of the second dielectric layer is n. Specifically, the thickness of the second dielectric layer is about 70 nm to 100 nm.

In the method for producing a transparent multilayer film according to the embodiment of the present invention, since all of the first dielectric layer, the transparent optical film, and the second dielectric layer are formed by a deposition method and are formed in a single layer, in a case where film formation by a sputtering apparatus is used in combination, the control is not complicated as in co-deposition, the configuration of the production apparatus is simple, and the production cost can be suppressed.

EXAMPLES

Hereinafter, the results of the verification of the method for producing a transparent optical film according to the embodiment of the present invention will be described.

Thermal Diffusion of High Standard Electrode Potential Metal into Silver (Ag) Layer As a high standard electrode potential metal, Au was used.

Layers of Ge, Ag, and Au were formed on a glass substrate by vacuum deposition in this order. The film formation temperature was set to room temperature. At this time, a sample 1 in which the film thickness of the Ge layer was 1 nm and the film thickness of the Au layer was 0.4 nm in common, and the film thickness of the Ag layer was 4 nm and a sample 2 in which the film thickness of the Ag layer was 40 nm were prepared.

Figure 6:
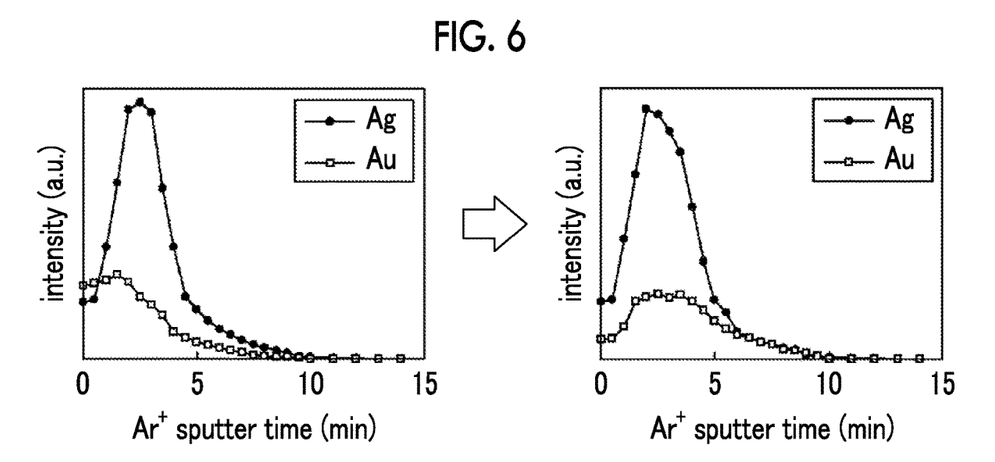
FIG. 6 is a view showing an Au diffusion state to an Ag layer having a thickness of 4 nm before and after a heating treatment.
Figure 7:
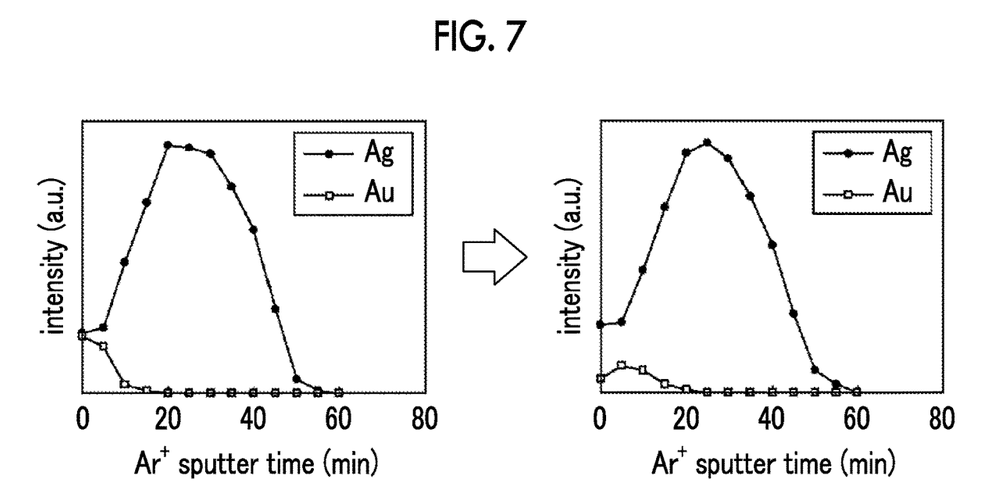
FIG. 7 is a view showing an Au diffusion state to an Ag layer having a thickness of 40 nm before and after a heating treatment.

Before and after a heat treatment was performed at 300° C. for 5 minutes, the samples 1 and 2 were subjected to XPS measurement to measure the elemental distribution in the depth direction. The results of XPS are shown in FIG. 6 and FIG. 7. FIG. 6 shows data regarding the sample 1 with the Ag layer having a film thickness of 4 nm, and FIG. 7 shows a data regarding the sample 2 with the Ag layer having a film thickness of 40 nm. In FIGS. 6 and 7, the left drawing shows a state before heating and the right drawing shows a state after heating. In addition, the horizontal axis represents cutting time (minute) and means the thickness direction depth. The vertical axis shows the amount of each element in arbitrary unit.

As shown in FIG. 6, it is found that in the sample 1 in which the film thickness of the Ag layer is 4 nm, the Au depth profile and the Ag depth profile are almost matched in the data after heating, and Au is diffused over the entire region in the thickness direction of the Ag layer. On the other hand, as shown in FIG. 7, it is found that in the sample 2 in which the film thickness of the Ag layer is 40 nm, in the data after heating, the Au peak is present on the surface side of the Ag layer, and Au is not diffused to the deep position exceeding 10 nm in the film thickness direction of the Ag layer.

In the production method according to the embodiment of the present invention, it is considered that since the film thickness at the time of film formation of the Ag layer is 6 nm or less and is very thin, Au is diffused over the entire region in the film thickness direction of the Ag layer, good alloying (mixing of Ag and Au) can be achieved.

Evaluation of Durability and Absorbance

Each of transparent multilayer films 60 of Examples 1 to 13 and Comparative Examples 1 to 4 was produced on a glass substrate, and the durability and absorption were evaluated.

Preparation Method

Figure 8:
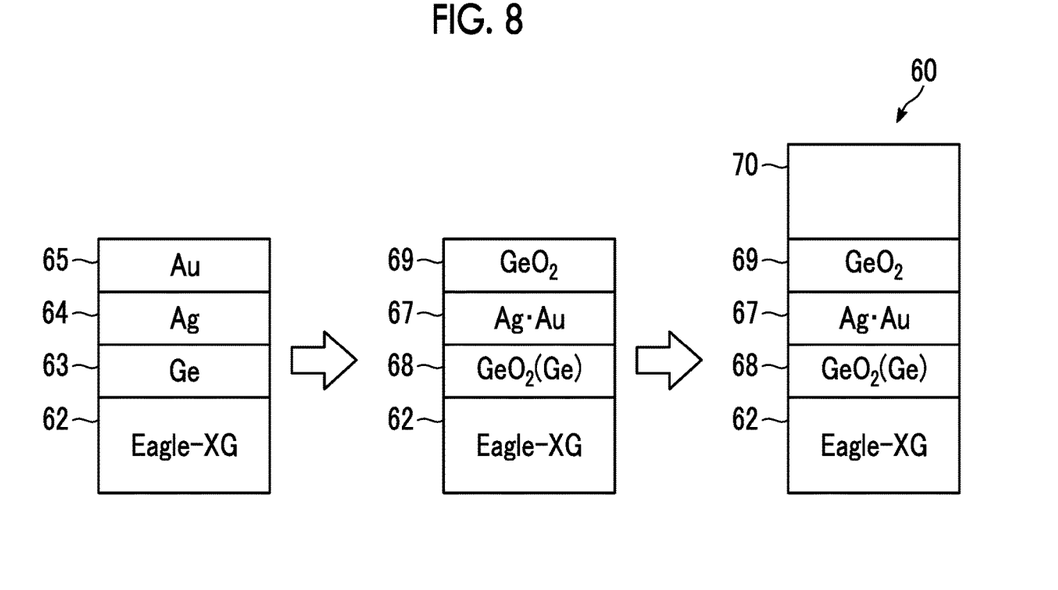
FIG. 8 is a view showing a production step of a transparent multilayer film for durability and absorptivity measurement.

FIG. 8 is a view showing production steps in Examples and Comparative Examples.

As a glass substrate 62, Eagle-XG (manufactured by Corning Incorporated) was used. The glass substrate was used after being washed.

On the glass substrate 62, a Ge layer 63, an Ag layer 64, and an Au layer 65 were respectively formed by vacuum deposition such that the Ge layer 63 as an anchor metal layer was formed at a film thickness of 1 nm and the Ag layer 64 was formed at each film thickness shown in Table 2 described later, and the Au layer 65 as a high standard electrode potential metal layer was formed at each film thickness shown in Table 2. EBX-1000 (manufactured by ULVAC, Inc.) was used as a vacuum apparatus.

Then, using a hot plate, a heating treatment was performed for 5 minutes at each temperature shown in Table 2 in the atmosphere, which is one mode of an oxygen-containing atmosphere, to perform alloying of Ag and Au and oxidize Ge. Thus, the Ge layer 63, the Ag layer 64, and the Au layer 65 became a $Ge/GeO_2$ anchor region 68, an Ag—Au layer (silver alloy layer) 67, and a $GeO_2$ cap region 69.

Then, a dielectric layer 70 of each material and film thickness described in Table 2 was formed. A film of $MgF_2$ and $SiO_2$ fluorine coat (F coat: SurfClear100 (manufactured by Canon Optron Co., Ltd.)) was formed by vacuum deposition. The substrate temperature at the time of film formation was set to room temperature.

The tests for the durability of the transparent multilayer films 60 of Examples and Comparative Examples obtained by the above procedure and the absorbance of the transparent optical film formed of the anchor region 68, the silver alloy layer 67, and the cap region 69 in each transparent multilayer film 60 was performed.

Durability

Each transparent multilayer film was immersed in 5% by mass saline solution and the abnormality occurrence time was visually measured to evaluate the durability. Since silver turns yellow in a case where silver is oxidized by saline solution, the time taken from immersion in saline solution to yellowing was examined and evaluated according to the following standards. The evaluation results are shown in Table 2 shown below.

A: 48 hours or longer
B: 24 hours or longer and shorter than 48 hours
C: 12 hours or longer and shorter than 24 hours
D: 5 minutes or longer and shorter than 12 hours
E: Shorter than 5 minutes Absorbance The transmittance and reflectance were measured for the transparent multilayer film of each Example and Comparative Example, and the absorbance was calculated. A U-4000 spectrophotometer (manufactured by Hitachi High-Technologies Corporation) was used for the measurement of the transmittance and reflectance. Further, by subtracting the absorbance of the substrate and the dielectric layer, the absorbance of the transparent optical film was substantially obtained. Here, the absorbance at a wavelength of 550 nm was evaluated based on the following standards. The evaluation results are shown in Table 2 shown below. In the transparent optical films, generally, the thicker the film thickness of silver, the larger the absorption of visible light. On the other hand, in a case where the film thickness of silver is excessively thin to cause granulation, plasmon absorption appears and the absorbance of visible light increases. That is, this means that as the absorbance becomes smaller, the smoother and thinner silver alloy layer is obtained.

A: 4% or less
B: More than 4% and 6% or less
C: More than 6% and 8% or less
D: More than 8% and 10% or less
E: More than 10% hand, in Comparative Examples 1 to 4, the evaluation of durability was D or lower or the evaluation of absorbance was E or lower, and the transparent multilayer films were not suitable for practical use.

Examples 1 to 5 have the same conditions except for the heating temperature. While the durability was equivalent in Examples 1 to 5, the absorbance was smallest in Example 4 n which the heating temperature was 300° C., and the absorbance was large in Examples 1 and 2 in which the temperature was 100° C. or lower. It is considered that this is because alloying progresses and the oxidation of Ge progresses due to the diffusion of Au into Ag.

In Examples 4 and 6 to 8, the transparent multilayer films were prepared under the same conditions except for the film thickness of the Au layer. The smaller the film thickness of the Au layer, the smaller the absorption, which is preferable. However, the poorer the durability, the smaller the film thickness of the Au layer. It was found that the effect of corrosion prevention by a high standard electrode potential metal such as Au is in a trade-off relationship with an increase in absorbance.

In Examples 9 to 12, the amount of Au is common, but the film thickness of the Ag layer is different. Basically, as the film thickness of the Ag layer becomes larger, the absorption increases. On the other hand, in Example 9, the increase in absorbance is considered to be due to the fact that since the film thickness of the Ag layer is too thin, planarization is more difficult, the growth of some grains occurs, and plasmon absorption appears.

From the comparison between Example 13 and Comparative Example 3, the effect of improving the durability by forming the transparent optical film including the silver

TABLE 2

| | Ge Film thickness (nm) | Ag Film thickness (nm) | Au Film thickness (nm) | Heating temperature (° C.) | Dielectric layer | Durability | Absorbance |
|---|---|---|---|---|---|---|---|
| Comparative Example 1 | 1 | 4 | — | — | $MgF_2$ 80 nm | E | E |
| Comparative Example 2 | 1 | 4 | — | 300 | $MgF_2$ 80 nm | E | A |
| Comparative Example 3 | 1 | 4 | — | 300 | $MgF_2$ 69 nm $SiO_2$ 5 nm F coat 16 nm | D | A |
| Comparative Example 4 | 1 | 4 | 0.4 | — | $MgF_2$ 80 nm | B | E |
| Example 1 | 1 | 4 | 0.4 | 50 | $MgF_2$ 80 nm | B | D |
| Example 2 | 1 | 4 | 0.4 | 100 | $MgF_2$ 80 nm | B | D |
| Example 3 | 1 | 4 | 0.4 | 200 | $MgF_2$ 80 nm | B | C |
| Example 4 | 1 | 4 | 0.4 | 300 | $MgF_2$ 80 nm | B | B |
| Example 5 | 1 | 4 | 0.4 | 400 | $MgF_2$ 80 nm | B | C |
| Example 6 | 1 | 4 | 0.4 | 300 | $MgF_2$ 80 nm | C | A |
| Example 7 | 1 | 4 | 0.4 | 300 | $MgF_2$ 80 nm | C | A |
| Example 8 | 1 | 4 | 0.4 | 300 | $MgF_2$ 80 nm | B | B |
| Example 9 | 1 | 2 | 0.4 | 300 | $MgF_2$ 80 nm | B | C |
| Example 10 | 1 | 3 | 0.4 | 300 | $MgF_2$ 80 nm | B | B |
| Example 11 | 1 | 5 | 0.4 | 300 | $MgF_2$ 80 nm | B | C |
| Example 12 | 1 | 6 | 0.4 | 300 | $MgF_2$ 80 nm | B | D |
| Example 13 | 1 | 4 | 0.4 | 300 | $MgF_2$ 69 nm $SiO_2$ 5 nm F coat 16 nm | A | B |

As shown in Table 2, in Examples 1 to 13 of the present invention, the evaluation of durability was C or higher, the evaluation of absorbance was D or higher, and the transparent multilayer films were practically preferable. On the other alloy layer formed of AgAu by forming the Au layer is apparent. In addition, by using the F coat and film formation of the Au layer in combination, particularly preferable durability is obtained.

Antireflection Film

The antireflection performance in an optical member including the antireflection film constituted of the first dielectric layer, the transparent optical film, and the second dielectric layer on the substrate was investigated. Here, an optical member 80 having a laminated structure shown in FIG. 9 was investigated.

Figure 9:
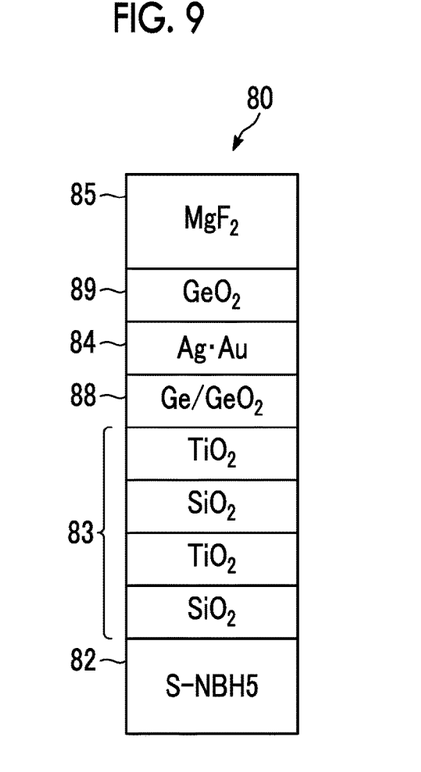
FIG. 9 is a side view showing a laminated structure of an optical member including an antireflection film on a substrate.

The optical member 80 has a structure in which a first dielectric layer 83 constituted of a total of four layers in which layers of $SiO_2$ and $TiO_2$ are alternately laminated, an anchor region 88 including Ge, which is an anchor metal, and $GeO_2$, a silver alloy layer (Ag—Au layer) 84 formed of AgAu, a cap region 89 including $GeO_2$, and a second dielectric layer 85 formed of $MgF_2$ are laminated on a substrate 82 formed of S—NBH 5 (manufactured by Ohara Inc.; refractive index: 1.66393). The antireflection film formed of the multilayer film laminated on the substrate 82 can be prepared by the method for producing a transparent multilayer film using the method for producing a transparent optical film according to the embodiment of the present invention.

In Table 3 shown below, the film thickness obtained by optimizing the film thickness using the layer constitution of the antireflection film used in the simulation and Essential Macleod (manufactured by Thin Film Center Inc.) is shown. In the simulation, the refractive index of $SiO_2$ was 1.462, the refractive index of $TiO_2$ was 2.291, and the refractive index of $MgF_2$ was 1.385. The amount of Au in the Ag—Au layer 84 was 10% by atom and the refractive index thereof was 0.2047. The refractive index of the Ag—Au layer was calculated based on the literature values of Ag and Au (Appl. Opt. 37, 5271-5283 (1998)) according to the method described in Optical Materials Springer P. 35. It was assumed that the region containing Ge is so thin that the region hardly affects the simulation results.

TABLE 3

| Laminated structure | Film thickness (nm) |
| --- | --- |
| $MgF_2$ | 83.0 |
| Ag•Au (10%) | 5.5 |
| $TiO_2$ | 16.9 |
| $SiO_2$ | 75.6 |
| $TiO_2$ | 6.2 |
| $SiO_2$ | 49.5 |
| Substrate S-NBH 5 | |

Figure 10:
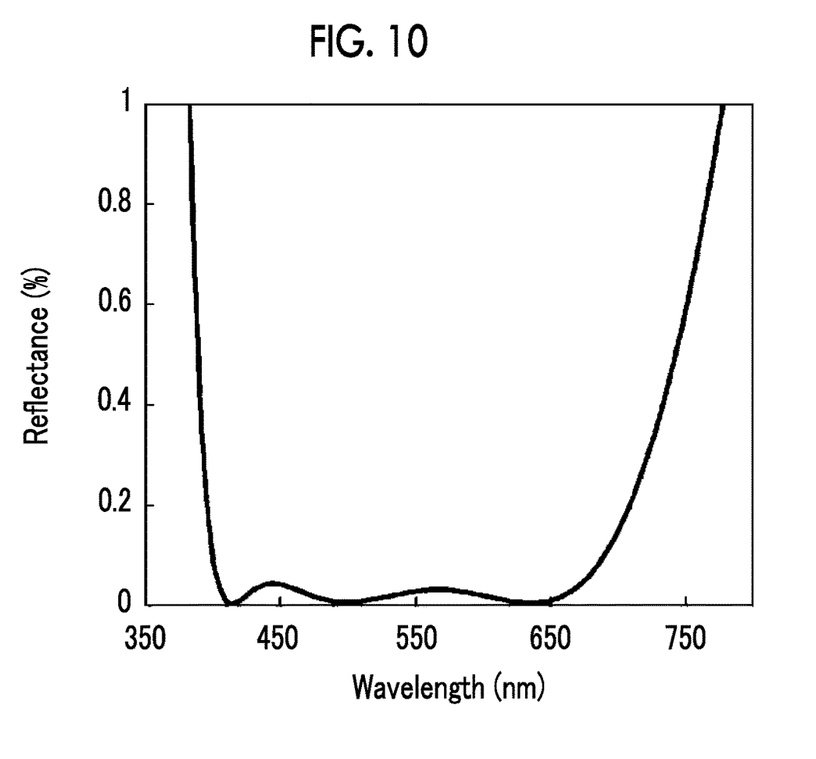
FIG. 10 is a view showing the wavelength dependence of reflectance obtained from the simulation of the optical member in FIG. 9.
Figure 11:
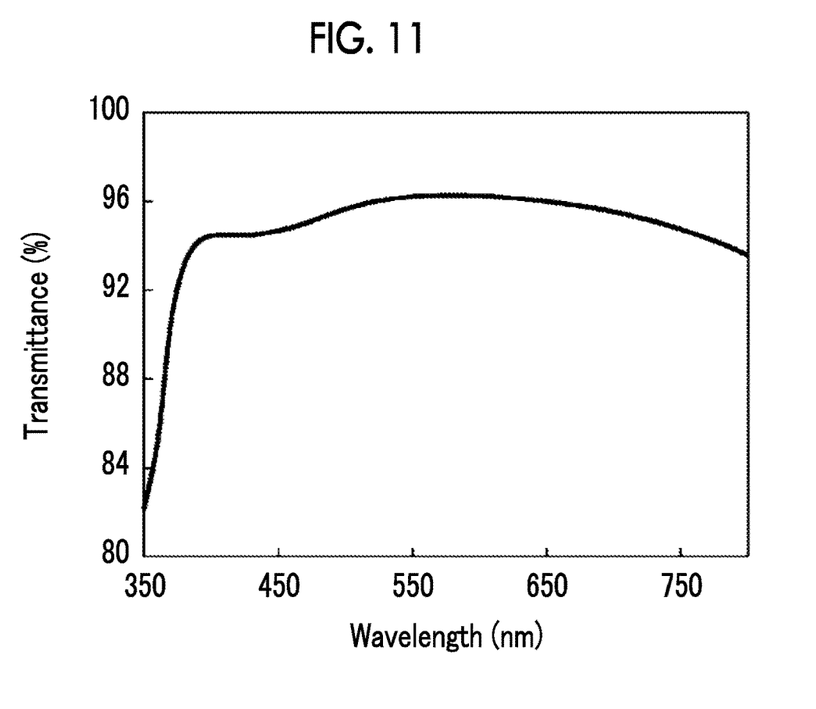
FIG. 11 is a view showing the wavelength dependence of transmittance obtained from the simulation of the optical member in FIG. 9.

FIGS. 10 and 11 respectively show wavelength dependence of reflectance and transmittance in a case where light is incident into the optical member from the antireflection film side. From FIG. 10, it is found that a reflectance of 0.1% or less can be realized over a very wide range of visible light. In addition, from FIG. 11, a transmittance of 93% or more can be realized over a very wide range of visible light at a wavelength of 400 nm to 800 nm.

EXPLANATION OF REFERENCES

1: transparent optical film
2: substrate
3: first dielectric layer
4: silver alloy layer
5: second dielectric layer
8: anchor region
9: cap region
10: transparent multilayer film
11: layer of high refractive index
12: layer of low refractive index
21: substrate
42: anchor metal layer
44: silver layer
46: high standard electrode potential metal layer
60: transparent multilayer film
62: glass substrate
63: Ge layer
64: Ag layer
65: Au layer
67: Ag—Au layer (silver alloy layer)
68: $GeO_2$ anchor region
69: $GeO_2$ cap region
70: dielectric layer
80: optical member
82: substrate
83: first dielectric layer
84: Ag—Au layer (silver alloy layer)
85: second dielectric layer
88: anchor region
89: cap region

What is claimed is:

1. A method for producing a transparent optical film including a silver alloy layer, the method comprising:
a film formation step of forming a silver layer and a high standard electrode potential metal layer so as to be laminated on a substrate, the film formation step including a silver deposition step of forming the silver layer, at a thickness of 6 nm or less, by vacuum deposition, and a high standard electrode potential metal deposition step of forming the high standard electrode potential metal layer, which is a layer formed of a high standard electrode potential metal that is gold, palladium or platinum, by vacuum deposition; and
an alloying step of forming the silver alloy layer by diffusing the high standard electrode potential metal within the silver layer by performing a heating treatment at a temperature of 50° C. or higher and 400° C. or lower, wherein:
the film formation step includes an anchor metal deposition step of forming an anchor metal layer, formed of an anchor metal having a lower surface energy than silver at a side closer to the substrate than the silver layer, by vacuum deposition,
the anchor metal deposition step, the high standard electrode potential metal deposition step, and the silver deposition step are performed in this order, and
an oxidation step of oxidizing at least a part of the anchor metal is performed simultaneously with forming the silver alloy layer by performing the alloying step under an oxygen-containing atmosphere after the anchor metal layer, the silver layer, and the high standard electrode potential metal layer are formed and laminated through the anchor metal deposition step, the silver deposition step, and the high standard electrode potential metal deposition step.

2. The method for producing a transparent optical film according to claim 1,
wherein an amount of the high standard electrode potential metal to be deposited in the high standard electrode potential metal deposition step is 10% by atom or less with respect to an amount of silver constituting the silver layer.

3. The method for producing a transparent optical film according to claim 1,
wherein germanium is used as the anchor metal.

4. The method for producing a transparent optical film according to claim 1,
wherein gold is used as the high standard electrode potential metal.

5. A method for producing a transparent multilayer film, the method comprising:
forming a first dielectric layer on a substrate by vacuum deposition;
forming a transparent optical film on the first dielectric layer using the method for producing a transparent optical film according to claim 1; and
forming a second dielectric layer on the transparent optical film by vacuum deposition to produce a transparent multilayer film.

6. The method for producing a transparent multilayer film according to claim 5, wherein:
as the first dielectric layer, a layer of high refractive index having a relatively high refractive index and a layer of low refractive index having a relatively low refractive index are alternately formed by vacuum deposition, and
an antireflection film having an antireflection function is produced as the transparent multilayer film.

7. A method for producing a transparent optical film including a silver alloy layer, the method comprising:
a film formation step of forming a silver layer and a high standard electrode potential metal layer so as to be laminated on a substrate, the film formation step including a silver deposition step of forming the silver layer, at a thickness of 6 nm or less, by vacuum deposition, and a high standard electrode potential metal deposition step of forming the high standard electrode potential metal layer, which is a layer formed of a high standard electrode potential metal that is gold, palladium or platinum, by vacuum deposition; and
an alloying step of forming the silver alloy layer by diffusing the high standard electrode potential metal within the silver layer by performing a heating treatment at a temperature of 50° C. or higher and 400° C. or lower, wherein:
the film formation step includes an anchor metal deposition step of forming an anchor metal layer, formed of an anchor metal having a lower surface energy than silver at a side closer to the substrate than the silver layer, by vacuum deposition,
the high standard electrode potential metal deposition step, the anchor metal deposition step, and the silver deposition step are performed in this order, and
an oxidation step of oxidizing at least a part of the anchor metal is performed simultaneously with forming the silver alloy layer by performing the alloying step under an oxygen-containing atmosphere after the anchor metal layer, the silver layer, and the high standard electrode potential metal layer are formed and laminated through the anchor metal deposition step, the silver deposition step, and the high standard electrode potential metal deposition step.

8. The method for producing a transparent optical film according to claim 7,
wherein an amount of the high standard electrode potential metal to be deposited in the high standard electrode potential metal deposition step is 10% by atom or less with respect to an amount of silver constituting the silver layer.

9. The method for producing a transparent optical film according to claim 7,
wherein germanium is used as the anchor metal.

10. The method for producing a transparent optical film according to claim 7,
wherein gold is used as the high standard electrode potential metal.

11. A method for producing a transparent multilayer film, the method comprising:
forming a first dielectric layer on a substrate by vacuum deposition;
forming a transparent optical film on the first dielectric layer using the method for producing a transparent optical film according to claim 7; and
forming a second dielectric layer on the transparent optical film by vacuum deposition to produce a transparent multilayer film.

12. The method for producing a transparent multilayer film according to claim 11, wherein:
as the first dielectric layer, a layer of high refractive index having a relatively high refractive index and a layer of low refractive index having a relatively low refractive index are alternately formed by vacuum deposition, and
an antireflection film having an antireflection function is produced as the transparent multilayer film.

13. A method for producing a transparent optical film including a silver alloy layer, the method comprising:
a film formation step of forming a silver layer and a high standard electrode potential metal layer so as to be laminated on a substrate, the film formation step including a silver deposition step of forming the silver layer, at a thickness of 6 nm or less, by vacuum deposition, and a high standard electrode potential metal deposition step of forming the high standard electrode potential metal layer, which is a layer formed of a high standard electrode potential metal that is gold, palladium or platinum, by vacuum deposition; and
an alloying step of forming the silver alloy layer by diffusing the high standard electrode potential metal within the silver layer by performing a heating treatment at a temperature of 50° C. or higher and 400° C. or lower, wherein:
the film formation step includes an anchor metal deposition step of forming an anchor metal layer, formed of an anchor metal having a lower surface energy than silver at a side closer to the substrate than the silver layer, by vacuum deposition,
an oxidation step of oxidizing at least a part of the anchor metal by performing a heating treatment under an oxygen-containing atmosphere is performed after the anchor metal layer and the silver layer are laminated on the substrate in this order by performing the anchor metal deposition step and the silver deposition step in this order, and
after the oxidation step, the high standard electrode potential metal deposition step is performed.

14. The method for producing a transparent optical film according to claim 13,
wherein the alloying step is performed simultaneously with the high standard electrode potential metal deposition step.

15. The method for producing a transparent optical film according to claim 13,
wherein an amount of the high standard electrode potential metal to be deposited in the high standard electrode potential metal deposition step is 10% by atom or less with respect to an amount of silver constituting the silver layer.

16. The method for producing a transparent optical film according to claim 13, wherein germanium is used as the anchor metal.

17. The method for producing a transparent optical film according to claim 13, wherein gold is used as the high standard electrode potential metal.

18. A method for producing a transparent multilayer film, the method comprising:
   forming a first dielectric layer on a substrate by vacuum deposition;
   forming a transparent optical film on the first dielectric layer using the method for producing a transparent optical film according to claim 13; and
   forming a second dielectric layer on the transparent optical film by vacuum deposition to produce a transparent multilayer film.

19. The method for producing a transparent multilayer film according to claim 18, wherein:
   as the first dielectric layer, a layer of high refractive index having a relatively high refractive index and a layer of low refractive index having a relatively low refractive index are alternately formed by vacuum deposition, and
   an antireflection film having an antireflection function is produced as the transparent multilayer film.

* * * * *